(12) United States Patent
Ho

(10) Patent No.: US 6,483,366 B2
(45) Date of Patent: Nov. 19, 2002

(54) BREAKDOWN-FREE NEGATIVE LEVEL SHIFTER

(75) Inventor: Chien-Hung Ho, Kaohsiung (TW)

(73) Assignee: Ememory Technology Inc., Hsinchu (TW)

( * ) Notice: Subject to any disclaimer, the term of this patent is extended or adjusted under 35 U.S.C. 154(b) by 0 days.

(21) Appl. No.: 09/962,714

(22) Filed: Sep. 24, 2001

(65) Prior Publication Data

US 2002/0105370 A1 Aug. 8, 2002

(30) Foreign Application Priority Data

Feb. 5, 2001 (TW) ....................................... 90102336 A

(51) Int. Cl.⁷ ............................................... H03L 5/00
(52) U.S. Cl. ......................................... 327/333; 326/81
(58) Field of Search ........................ 327/108–112, 333; 326/62, 63, 80–83

(56) References Cited

U.S. PATENT DOCUMENTS 6,242,962 B1 * 6/2001 Nakamura .................. 327/333

* cited by examiner

*Primary Examiner*—Kenneth B. Wells
(74) *Attorney, Agent, or Firm*—J. C. Patents

(57) ABSTRACT

A two-stage negative level shifting circuit for preventing field breakdown due to an excessive voltage shift. The first stage has a first voltage distributor and a first driver and the second stage has a second voltage distributor and a second driver. In the first stage, an input voltage shifting between a positive voltage and a ground voltage is converted into a voltage shifting between a first negative voltage and the ground voltage. In the second stage, the voltage is further converted into a voltage shifting between the ground voltage and a second negative voltage, which has a larger absolute magnitude than the first negative voltage.

13 Claims, 2 Drawing Sheets

US 6,483,366 B2

BREAKDOWN-FREE NEGATIVE LEVEL SHIFTER

CROSS-REFERENCE TO RELATED APPLICATION

This application claims the priority benefit of Taiwan application serial no. 90102336, filed on Feb. 5, 2001.

BACKGROUND OF THE INVENTION

1. Field of Invention

The present invention relates to a negative level shifter. More particularly, the present invention relates to a field breakdown-free negative level shifter.

2. Description of Related Art

FIG. 1 is a circuit diagram of a conventional negative level shifter. As shown in FIG. 1, the negative level shifter consists of a pair of PMOS transistors 10 and 12 and a pair of NMOS transistors 14 and 16. An input voltage is fed to a point A of the circuit. The source terminal of the PMOS transistor 10 and the gate terminal of the PMOS transistor 12 are connected to point A. The gate terminal of the PMOS transistor 10 is connected to a ground voltage Vss. The source terminal of the PMOS transistor 12 is connected to a supply voltage Vdd. The drain terminal of the PMOS transistor 10 is connected to both the drain terminal of the NMOS transistor 14 and the gate terminal of the NMOS transistor 16. In addition, the drain terminal of the PMOS transistor 12 is connected to both the gate terminal of the NMOS transistor 14 and the drain terminal of the NMOS transistor 16. The source terminal of the NMOS transistors 14 and 16 are connected together for receiving a negative voltage (for example, −5V or −10V).

In operation, an input voltage within the range 3.3V to 0V is applied to the input terminal at point A. When 3.3V are applied to point A, the PMOS transistor 10 having its gate terminal connected to a ground voltage Vss is conductive. The PMOS transistor 12 is disabled. Since the PMOS transistor 10 is conductive, 3.3V are applied to point B, leading to the conduction of the NMOS transistor 16. Hence, the negative voltage connected to the source terminal of the NMOS transistor 16 is transmitted to point C as an output voltage and the NMOS transistor 14, whose gate terminal is connected to point C, is disabled. Conversely, when 0V is applied to point A, the PMOS transistor 10 is disabled. However, the PMOS transistor 12 is conductive so that a supply voltage (for example, 3.3V) is directly transmitted to point C. In the meantime, the NMOS transistor 14 is conductive and the negative voltage at the source terminal of the NMOS transistor 14 is transmitted to point B. Hence, the NMOS transistor 16 is disabled.

According to the aforementioned operation, a negative shifting of −5V or −10V is obtained. One critical problem for this type of circuit is field breakdown because most circuit breakdown at a change in field voltage smaller than 12V. Therefore, when an input voltage change from 3.3V to 0V or vice versa occurs, if the desired negative voltage is large, such as −10V, output voltage must vary between −10V to 3.3V. The 13.3V voltage fluctuation at the output terminal exceeds the greatest permitted breakdown voltage.

SUMMARY OF THE INVENTION

Accordingly, one object of the present invention is to provide a field breakdown free negative level shifting circuit for preventing too much output voltage variation when the output negative voltage desired is large.

To achieve these and other advantages and in accordance with the purpose of the invention, as embodied and broadly described herein, the invention provides a two-stage negative level shifting circuit for preventing field breakdown. The two-stage negative level shifting circuit includes a first stage circuit having a first voltage distributor and a first driver and a second stage circuit having a second voltage distributor and a second driver. The first voltage distributor converts an input voltage shifting between a ground voltage and a positive voltage to a corresponding first distributor voltage or output voltage shifting between a first negative voltage and a positive voltage. The first driver is connected to the first voltage distributor for converting the first distributor voltage shifting between the positive voltage and the first negative voltage into corresponding first driving voltage or output voltage shifting between the first negative voltage and the ground voltage. The second voltage distributor is connected to the first driver for converting the first driving voltage shifting between the ground voltage and the first negative voltage into a corresponding second distributor voltage or output voltage shifting between a second negative voltage and the ground voltage. The second driver is connected to the second voltage distributor for converting the second distributor voltage shifting between the second negative voltage and the ground voltage into a corresponding second driving voltage shifting between the ground voltage and the second negative voltage. The absolute value of the second negative voltage is greater than the first negative voltage.

The first voltage distributor includes a first PMOS transistor, a first NMOS transistor, a second PMOS transistor and a second NMOS transistor. The source terminal of the PMOS transistor receives the input voltage and the gate terminal of the PMOS transistor receives the ground voltage. The drain terminal of the first NMOS transistor connects with the drain terminal of the PMOS transistor and the source terminal of the first NMOS transistor receives the first negative voltage. The source terminal of the second PMOS transistor receives a supply voltage and the gate terminal of the second PMOS transistor receives the input voltage. The drain terminal of the second PMOS transistor serves as an output for the first distributor voltage and connects with the gate terminal of the first NMOS transistor. The drain terminal of the second NMOS transistor connects with the drain terminal of the second PMOS transistor and the gate terminal of the second NMOS transistor connects with the drain terminal of the first NMOS transistor. The source terminal of the second NMOS transistor receives the first negative voltage. The supply voltage is a positive voltage having a magnitude of 3.3V and the first negative voltage is −5V, for example.

The first driver includes a third PMOS transistor and a third NMOS transistor. The source terminal of the third PMOS transistor receives the ground voltage and the gate terminal of the third PMOS transistor receives the first distributor voltage. The drain terminal of the third NMOS transistor connects with the drain terminal of the third PMOS transistor to serve as an output for the first driver voltage. The gate terminal of the third NMOS transistor receives the first distributor voltage and the source terminal of the third NMOS transistor receives the first negative voltage.

The second voltage distributor includes a fourth PMOS transistor, a fourth NMOS transistor, a fifth PMOS transistor and a fifth NMOS transistor. The source terminal of the fourth PMOS transistor receives the first driving voltage and the gate terminal of the fourth PMOS transistor receives the first negative voltage. The drain terminal of the fourth NMOS transistor connects with the drain terminal of the fourth PMOS transistor and the source terminal of the fourth NMOS transistor receives the second negative voltage. The source terminal of the fifth PMOS transistor receives the ground voltage and the gate terminal of the fifth PMOS transistor receives the first driving voltage. The drain terminal of the fifth PMOS transistor serves as an output for the second distributor voltage and connects with the gate terminal of the fourth NMOS transistor. The drain terminal of the fifth NMOS transistor connects with the drain terminal of the fifth PMOS transistor and the gate terminal of the fifth NMOS transistor connects with the drain terminal of the fourth NMOS transistor. The source terminal of the fifth NMOS transistor receives the second negative voltage. The second negative voltage is −10V, for example.

The second driver includes a sixth PMOS transistor and a sixth NMOS transistor. The source terminal of the sixth PMOS transistor receives the ground voltage and the gate terminal of the sixth PMOS transistor receives the second distributor voltage. The drain terminal of the sixth NMOS transistor connects with the drain terminal of the sixth PMOS transistor to serve as an output for the second driving voltage. The gate terminal of the sixth NMOS transistor receives the second distributor voltage and the source terminal of the sixth NMOS transistor receives the second negative voltage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
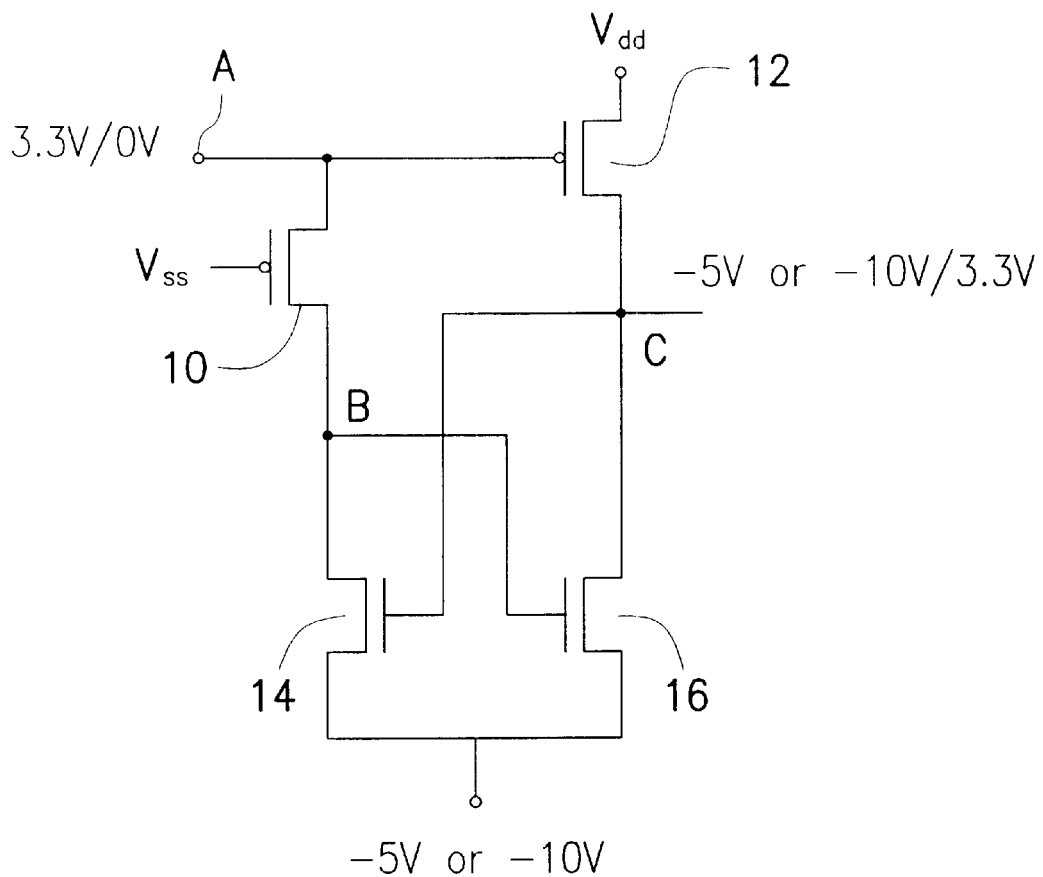
FIG. 1 is a circuit diagram of a conventional negative level shifting circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
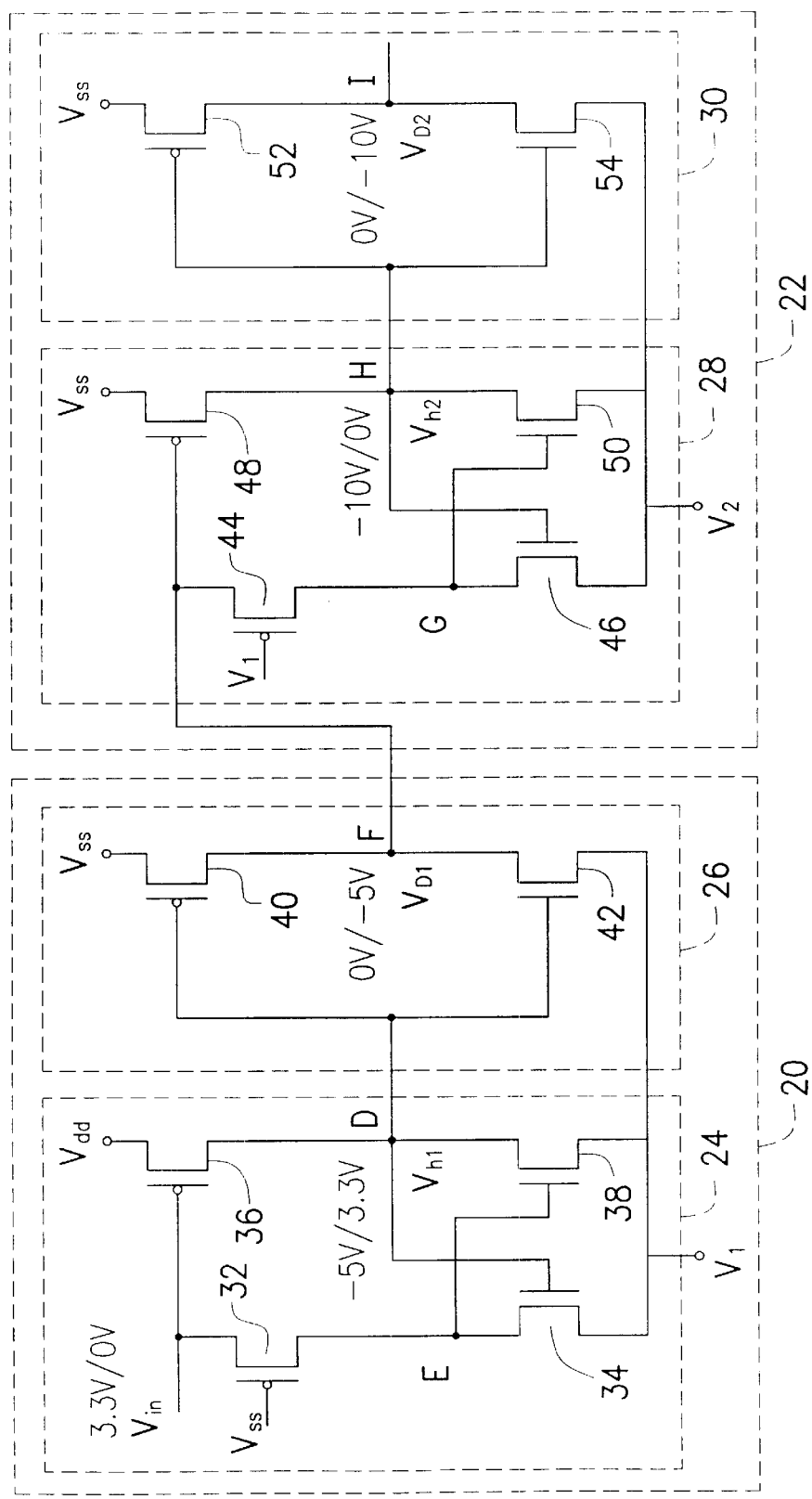
FIG. 2 is a circuit diagram of field breakdown free negative level shifting circuit according to one preferred embodiment of this invention.

FIG. 2 is a circuit diagram of field breakdown free negative level shifting circuit according to one preferred embodiment of this invention. As shown in FIG. 2, the field breakdown free negative level shifting circuit of this invention can be divided into two major stages 20 and 22. The first stage circuit 20 includes a first voltage distributor 24 and a first driver 26 and the second stage circuit 22 includes a second voltage distributor 28 and a second driver 30.

The first voltage distributor 24 includes a first PMOS transistor 32, a first NMOS transistor 34, a second PMOS transistor 36 and a second NMOS transistor 38. The source terminal of the first PMOS transistor 32 receives an input voltage Vin and the gate terminal of the first PMOS transistor 32 is under the control of a ground voltage Vss. The drain terminal of the first NMOS transistor connects with the drain terminal of the first PMOS transistor 32 and the source terminal of the first NMOS transistor receives a first negative voltage V1 (for example, −5V). The source terminal of the second PMOS transistor 36 receives a supply voltage Vdd (for example, 3.3V) and the gate terminal of the second PMOS transistor 36 receives the input voltage Vin. The drain terminal of the second PMOS transistor 36 serves as an output voltage (at point D) for the first distributor voltage Vh1 and connects to the gate terminal of the first NMOS transistor 34. The drain terminal of the second NMOS transistor 38 connects with the drain terminal of the second PMOS transistor 36 and the gate terminal of the second NMOS transistor connected to the drain terminal of the first NMOS transistor 34. The source terminal of the second NMOS transistor receives the first negative voltage V1.

The first driver 26 includes a third PMOS transistor 40 and a third NMOS transistor 42. The source terminal of the third PMOS transistor receives the ground voltage Vss and the gate terminal of the third PMOS transistor receives the first distributor voltage Vh1. The drain terminal of the third NMOS transistor connects with the drain terminal of the third PMOS transistor 40 and outputs a first driving voltage $V_{D1}$. The gate terminal of the third NMOS transistor receives the first distributor voltage Vh1 and the source terminal of the third NMOS transistor receives the first negative voltage V1.

The second distributor 28 includes a fourth PMOS transistor 44, a fourth NMOS transistor 46, a fifth PMOS transistor 48 and a fifth NMOS transistor 50. The source terminal of the fourth PMOS transistor 44 receives the first driving voltage $V_{D1}$ and the gate terminal of the fourth PMOS transistor 44 receives the first negative voltage V1. The drain terminal of the fourth NMOS transistor connects with the drain terminal of the fourth PMOS transistor 44 and the source terminal of the fourth NMOS transistor 46 receives a second negative voltage V2(for example, −10V). The source terminal of the fifth PMOS transistor receives the ground voltage Vss and the gate terminal of the fifth PMOS transistor receives the first driving voltage $V_{D1}$. The drain terminal of the fifth PMOS transistor outputs a second distributor voltage Vh2 at point H and point H connects with the gate terminal of the fourth NMOS transistor 46. The drain terminal of the fifth NMOS transistor connects with the drain terminal of the fifth PMOS transistor 48 and the gate terminal of the fifth NMOS transistor connects with the drain terminal of the fourth NMOS transistor 46. The source terminal of the fifth NMOS transistor receives the second negative voltage V2.

The second driver 30 includes a sixth PMOS transistor 52 and a sixth NMOS transistor 54. The source terminal of the PMOS transistor 52 receives the ground voltage Vss and the gate terminal receives the second distributor voltage Vh2. The drain terminal of the sixth NMOS transistor connects with the drain terminal of the sixth PMOS transistor 52 to output a second driving voltage $V_{D2}$. The gate terminal of the sixth NMOS transistor 54 receives the second distributor voltage Vh2 and the source terminal of the sixth NMOS transistor 54 receives the second negative voltage V2.

To illustrate the operation of the circuit shown in FIG. 2, an input voltage of, for example, 3.3V is applied to the input terminal of the first distributor 24. Since the gate terminal of the PMOS transistor 32 is connected to a ground voltage Vss and the source terminal of the PMOS transistor is connected to an input voltage 3.3V, the first PMOS transistor 32 is conductive. Because the source terminal of the second PMOS transistor 36 is connected to a voltage supply Vdd (for example, 3.3V) and the gate terminal of the second PMOS transistor 36 is connected to an input voltage 3.3V, the second PMOS transistor 36 is disabled. Due to the conduction of the first PMOS transistor 32, a 3.3V is transferred to point E leading to the conduction of the second NMOS transistor 38. Hence, the first negative voltage (for example, −5V) connected to the source terminal of the NMOS transistor 38 is transferred to point D as an output. In other words, the first distributor voltage Vh1 outputs a −5V. In the meantime, the first NMOS transistor 34 having a gate terminal connected to the point D is disabled.

The first distributor voltage Vh1 (at −5V) is fed to the first driver 26 so that the third PMOS transistor 40 is conductive, Since the source terminal of the third PMOS transistor 40 is connected to the ground voltage Vss (for example, 0V), a 0V is directly sent to point F so that a first driving voltage $V_{D1}$, of 0V is output. However, the third NMOS transistor 42 is disabled due to the first distributor voltage Vh1 of −5V and the source terminal of the third NMOS transistor 42 connected to a negative voltage of −5V.

A driving voltage VD1 of 0V is supplied to the source terminal of the fourth PMOS transistor 44 and the gate terminal of the fifth PMOS transistor 48 inside the second distributor 28. Since the gate terminal of the fourth PMOS transistor 44 is connected to the first negative voltage V1 having a voltage of −5V, the 0V driving voltage $V_{D1}$ received by the source terminal of the fourth PMOS transistor 44 is higher than the gate voltage of −5V. Therefore, the fourth PMOS transistor 44 is conductive and the 0V is supplied to point G. Hence, the fifth NMOS transistor 50 having a source terminal connected to the negative voltage V2 (for example, −10V) is conductive. Ultimately, the −10V is supplied to point H to produce −10V at the second distributor voltage Vh2 terminal. In addition, the gate terminal of the fifth PMOS transistor 48 inside the second voltage distributor 28 receives 0V driving voltage VD1. Furthermore, the source terminal of the fifth PMOS transistor 48 is connected to a ground voltage Vss so that the fifth PMOS transistor 48 is disabled. Since the −10V at point H is supplied to the gate terminal of the fourth NMOS transistor 46 and the source terminal of the fourth NMOS transistor 46 is connected to the second negative voltage V2 of −10V, the fourth NMOS transistor 46 is non-conductive.

The −10V at the second distributor voltage Vh2 terminal is fed to the gate terminal of the sixth PMOS transistor 52 and the sixth NMOS transistor 54 of the second driver 30. The sixth PMOS transistor 52 having a source terminal connected to the ground voltage Vss=0 is conductive. Hence, point I or the output of the second driver voltage $VD_2$ has a zero voltage. Because the source terminal and the gate terminal of the sixth NMOS transistor 54 are both connected to the second negative voltage Vh2 (−10V), the sixth NMOS transistor 54 is non-conductive.

On the other hand, when a 0V is applied to the input voltage Vin terminal, both the source and the gate terminal of the first PMOS transistor 32 inside the first voltage distributor 24 receives a zero voltage. Hence, the first PMOS transistor 32 is disabled. However, because the source terminal of the second PMOS transistor 36 is connected to a supply voltage Vdd (for example, 3.3V), the second PMOS transistor 36 is conductive and channels the supply voltage Vdd (3.3V) directly to point D. Hence, the first distributor voltage Vh1 has an output voltage of 3.3V. Meanwhile, the first distributor voltage Vh1 renders the first NMOS transistor 34 conductive so that the first negative voltage V1 (for example, −5V) connected to the source terminal of the first NMOS transistor 34 is transferred to point E. Since both the gate terminal and the source terminal of the second NMOS transistor 38 are at −5V, the second NMOS transistor 38 is disabled.

The 3.3V first distributor voltage Vh1 is fed to the gate terminal of the third NMOS transistor 42 within the first driver 26. The source terminal of the third NMOS transistor 42 receives the first negative voltage V1=−5V. Hence, the third NMOS transistor 42 is conductive and point F or the first driving voltage $V_{D1}$, is at the first negative voltage V1=−5V. However, the third PMOS transistor 40 is disabled because its gate terminal is connected to the first distributor voltage Vh1 and its source terminal is connected to a ground voltage Vss.

The −5V at the driving voltage $V_{D1}$, terminal is fed to the source terminal of the fourth PMOS transistor 44 within the second voltage distributor 28. Since the gate terminal of the fourth PMOS transistor 4 is connected to the first negative voltage V1=5V the fourth PMOS transistor is disabled. However, the −5V at the driving voltage $V_{D1}$ is fed the gate terminal of the fifth PMOS transistor 48. Since the source terminal of the fifth PMOS transistor 48 is connected to a ground voltage Vss=0V, which is a higher voltage relative to the −5V at the gate terminal, the fifth PMOS transistor 48 is conductive. The 0V is directly sent to point H to produce a 0V second distributor voltage Vh2 output. In addition, the gate terminal of the fourth NMOS transistor 46 is connected to the 0V at point H and the source terminal of the fourth NMOS transistor 46 is connected to the second negative voltage V2=−10V. Hence, the fourth NMOS transistor 46 is conductive leading to point G at −10V. Due to the connection of point G with the gate terminal of the fifth NMOS transistor 50, the fifth NMOS transistor 50 is disabled.

The 0V at the second distributor voltage Vh2 terminal is fed to the gate terminal of the sixth PMOS transistor 52 and the sixth NMOS transistor 54 inside the second driver 30. The sixth NMOS transistor 54 having its source terminal connected to the second negative voltage V2 is conductive. A voltage of −10V appears at point I serving as the second driving voltage $V_{D2}$. Since the source terminal of the sixth PMOS transistor 52 is connected to the ground voltage Vss and the gate terminal is connected to the second distributor voltage Vh2 at 0V, the sixth PMOS transistor 52 is disabled, In brief, the first voltage distributor 24 converts the 3.3V/0V input voltage Vin into a first distributor voltage Vh1 of −5V/3.3V (first negative voltage) at point D. The first driver 26 converts the first distributor voltage Vh1 of −5V/3.3V at point D into a first driving voltage $V_{D1}$, of 0V/−5V at point F. The second voltage distributor 28 converts the driving voltage $V_{D1}$, of 0V/−5V at point F into a second distributor voltage Vh2 of −0V/0V (second negative voltage) at point H. Finally, the second driver 30 converts the second distributor voltage Vh2 of −10V/0V at point H into a second driving voltage $V_{D2}$ of 0V/−10V at point I. The shifts in voltages at point D, F, H and I are 3.3V, 5V, 10V and 10V respectively. Since all of the voltage shifts are within the maximum shift level of about 12V, field breakdown is prevented.

In conclusion, one major aspect of this invention is the division of the negative level shifting circuit into two separate stages so that shift voltage level never exceeds an ultimate breakdown voltage of about 12V. Obviously, for a larger negative voltage, more stages may be introduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A field breakdown free negative level shifting circuit, comprising:
   a first voltage distributor for receiving an input voltage shifting between a ground voltage and a positive voltage and converting the input voltage into a first distributor voltage shifting between the positive voltage and a first negative voltage;
   a first driver connected to the first voltage distributor for receiving the first distributor voltage shifting between the positive voltage and the first negative voltage and converting the first distributor voltage into a first driving voltage shifting between the first negative voltage and the ground voltage;
   a second voltage distributor connected to the first driver for receiving the first driving voltage shifting between the ground voltage and the first negative voltage and converting the first driving voltage into a second distributor voltage shifting between a second negative voltage and the ground voltage; and
   a second driver circuit connected to the second voltage distributor for receiving the second distributor voltage shifting between the second negative voltage and the ground voltage and converting the second distributor voltage into a second driving voltage shifting between the ground voltage and the second negative voltage;
   wherein an absolute value of the second negative voltage is greater than the first negative voltage, and
   wherein the first voltage distributor further comprises:
      a first PMOS transistor having a source terminal, a gate terminal and a drain terminal, wherein the source terminal of the first PMOS transistor receives the input voltage and the gate terminal of the first PMOS transistor receives the ground voltage;
      a first NMOS transistor having a source terminal, a gate terminal and a drain terminal, wherein the drain terminal of the first NMOS transistor connects with the drain terminal of the first PMOS transistor and the source terminal of the first NMOS transistor receives the first negative voltage;
      a second PMOS transistor having a source terminal, a gate terminal and a drain terminal, wherein the source terminal of the second PMOS transistor receives a supply voltage, the gate terminal of the second PMOS transistor receives the input voltage, and the drain terminal of the second PMOS transistor serves as an output for the first distributor voltage and connects with the gate terminal of the first NMOS transistor; and
      a second NMOS transistor having a source terminal, a gate teal and a drain terminal, wherein the drain terminal of the second NMOS transistor connects with the drain terminal of the second PMOS transistor, the gate terminal of the second NMOS transistor connects with the drain terminal of the first NMOS transistor, and the source terminal of the second NMOS transistor receives the first negative voltage.

2. The negative level shifting circuit of claim 1, wherein a magnitude of the supply voltage and a magnitude of the positive voltage are identical.

3. The negative level shifting circuit of claim 1, wherein a positive voltage of the input voltage includes 3.3V.

4. The negative level shifting circuit of claim 1, wherein the first negative voltage includes −5V.

5. The negative level shifting circuit of claim 1, wherein the first driver further comprises:
   a third PMOS transistor having a source terminal, a gate terminal and a drain terminal, wherein the source terminal of the third PMOS transistor receives the ground voltage and the gate terminal of the third PMOS transistor receives the first distributor voltage; and
   a third NMOS transistor having a source terminal a gate terminal and a drain terminal, wherein the drain terminal of the third NMOS transistor connects with the drain terminal of the third PMOS transistor to serve as a first driving voltage output, the gate terminal of the third NMOS transistor receives the first distributor voltage and the source terminal of the third NMOS transistor receives the first negative voltage.

6. The negative level shifting circuit of claim 1, wherein the second voltage distributor further comprises:
   a fourth PMOS transistor having a source terminal, a gate terminal and a drain terminal, wherein the source terminal of the fourth PMOS transistor receives the first driving voltage and the gate terminal of the fourth PMOS transistor receives the first negative voltage;
   a fourth NMOS transistor having a source terminal, a gate terminal and a drain terminal, wherein the drain terminal of the fourth NMOS transistor connects with the drain terminal of the fourth PMOS transistor and the source terminal of the fourth NMOS transistor receives the second negative voltage;
   a fifth PMOS transistor having a source terminal, a gate terminal and a drain terminal, wherein the source terminal of the fifth PMOS transistor receives the ground voltage, the gate terminal of the fifth PMOS transistor receives the first driving voltage, and the drain terminal of the fifth PMOS transistor serves as an output for the second distributor voltage and connects with the gate terminal of the fourth NMOS transistor; and
   a fifth NMOS transistor having a source terminal, a gate terminal and a drain terminal, wherein the drain terminal of the fifth NMOS transistor connects with the drain terminal of the fifth PMOS transistor, the gate terminal of the fifth NMOS transistor connects with the drain terminal of the fourth NMOS transistor, and the source terminal of the fifth NMOS transistor receives the second negative voltage.

7. The negative level shifting circuit of claim 1, wherein the second negative voltage includes −10V.

8. The negative level shifting circuit of claim 1, wherein the first driver further comprises:
   a sixth PMOS transistor having a source terminal, a gate terminal and a drain terminal, wherein the source terminal of the sixth PMOS transistor receives the ground voltage and the gate terminal of the sixth PMOS transistor receives the second distributor voltage; and
   a sixth NMOS transistor having a source terminal a gate terminal and a drain terminal, wherein the drain terminal of the sixth NMOS transistor connects with the drain terminal of the sixth PMOS transistor to serve as a second driving voltage output, the gate terminal of the sixth NMOS transistor receives the second distributor voltage and the source terminal of the sixth NMOS transistor receives the second negative voltage.

9. A field breakdown free negative level shifting circuit, comprising:

a first PMOS transistor having a source terminal, a gate terminal and a drain terminal, wherein the source terminal of the first PMOS transistor receives an input voltage, the input voltage shifts between a positive voltage and a ground voltage and the gate terminal of the first PMOS transistor receives the ground voltage;

a first NMOS transistor having a source terminal, a gate terminal and a drain terminal, wherein the drain terminal of the first NMOS transistor connects with the drain terminal of the first PMOS transistor and the source terminal of the first NMOS transistor receives a first negative voltage;

a second PMOS transistor having a source terminal, a gate terminal and a drain terminal, wherein the source terminal of the second PMOS transistor receives a supply voltage, the gate terminal of the second PMOS transistor receives the input voltage, and the drain terminal of the second PMOS transistor connects with the gate terminal of the first NMOS transistor;

a second NMOS transistor having a source terminal, a gate terminal and a drain terminal, wherein the drain terminal of the second NMOS transistor connects with the drain terminal of the second PMOS transistor, the gate terminal of the second NMOS transistor connects with the drain terminal of the first NMOS transistor, and the source terminal of the second NMOS transistor receives the first negative voltage;

a third PMOS transistor having a source terminal, a gate terminal and a drain terminal, wherein the source terminal of the third PMOS transistor receives the ground voltage and the gate terminal of the third PMOS transistor connects with the drain terminal of the second PMOS transistor;

a third NMOS transistor having a source terminal a gate terminal and a drain terminal, wherein the drain terminal of the third NMOS transistor connects with the drain terminal of the third PMOS transistor, the gate terminal of the third NMOS transistor connects with the drain terminal of the second PMOS transistor and the source terminal of the third NMOS transistor receives the first negative voltage;

a fourth PMOS transistor having a source terminal, a gate terminal and a drain terminal, wherein the source terminal of the fourth PMOS transistor connects with the drain terminal of the third NMOS transistor and the gate terminal of the fourth PMOS transistor receives the first negative voltage;

a fourth NMOS transistor having a source terminal, a gate terminal and a drain terminal, wherein the drain terminal of the fourth NMOS transistor connects with the drain terminal of the fourth PMOS transistor and the source terminal of the fourth NMOS transistor receives a second negative voltage;

a fifth PMOS transistor having a source terminal, a gate terminal and a drain terminal, wherein the source terminal of the fifth PMOS transistor receives the ground voltage, the gate terminal of the fifth PMOS transistor connects with the drain terminal of the third NMOS transistor, and the drain terminal of the fifth PMOS transistor connects with the gate terminal of the fourth NMOS transistor;

a fifth NMOS transistor having a source terminal, a gate terminal and a drain terminal, wherein the drain terminal of the fifth NMOS transistor connects with the drain terminal of the fifth PMOS transistor, the gate terminal of the fifth NMOS transistor connects with the drain terminal of the fourth NMOS transistor, and the source terminal of the fifth NMOS transistor receives the second negative voltage;

a sixth PMOS transistor having a source terminal, a gate terminal and a drain terminal, wherein the source terminal of the sixth PMOS transistor receives the ground voltage and the gate terminal of the sixth PMOS transistor connects with the drain terminal of the fifth NMOS transistor; and a sixth NMOS transistor having a source terminal a gate terminal and a drain terminal, wherein the drain terminal of the sixth NMOS transistor connects with the drain terminal of the sixth PMOS transistor to serve as a negative voltage level output, the gate terminal of the sixth NMOS transistor connects with the drain terminal of the fifth PMOS transistor and the source terminal of the sixth NMOS transistor receives the second negative voltage.

10. The negative level shifting circuit of claim 9, wherein a magnitude of the supply voltage and a magnitude of the positive voltage are identical.

11. The negative level shifting circuit of claim 9, wherein the positive voltage of the input voltage includes 3.3V.

12. The negative level shifting circuit of claim 9, wherein the first negative voltage includes −5V.

13. The negative level shifting circuit of claim 9, wherein the second negative voltage includes −10V.

* * * * *